(12) United States Patent
Kobayashi et al.

(10) Patent No.: US 10,312,727 B2
(45) Date of Patent: Jun. 4, 2019

(54) POWER SUPPLY DEVICE

(71) Applicant: FUJI ELECTRIC CO., LTD., Kanagawa (JP)

(72) Inventors: Hiroyuki Kobayashi, Kobe (JP); Hiromu Takubo, Hachioji (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 197 days.

(21) Appl. No.: 15/390,554

(22) Filed: Dec. 26, 2016

(65) Prior Publication Data

US 2017/0244275 A1  Aug. 24, 2017

(30) Foreign Application Priority Data

Feb. 22, 2016  (JP) .................................. 2016-031258

(51) Int. Cl.
| | |
|---|---|
| *H02J 7/00* | (2006.01) |
| *H02J 9/06* | (2006.01) |
| *H02M 7/06* | (2006.01) |
| *H02M 7/44* | (2006.01) |
| *H05K 7/20* | (2006.01) |

(52) U.S. Cl.
CPC ............ *H02J 9/061* (2013.01); *H02J 7/0068* (2013.01); *H02M 7/06* (2013.01); *H02M 7/44* (2013.01); *H05K 7/20172* (2013.01); *H05K 7/20409* (2013.01); *H05K 7/20909* (2013.01)

(58) Field of Classification Search
CPC .... H02J 9/061; H02J 7/0068; H05K 7/20909; H05K 7/20172
See application file for complete search history.

(56) References Cited

U.S. PATENT DOCUMENTS

2015/0208554 A1*  7/2015  Leigh ..................... G06F 1/20
                                                   165/80.3
2017/0084516 A1*  3/2017  Harada ................. H01L 23/467

FOREIGN PATENT DOCUMENTS

JP  2005-269699 A  9/2005

* cited by examiner

*Primary Examiner* — Jeffrey M Shin (57) ABSTRACT

In power supply devices, it is prevented to cool the components that actually do not need to be cooled.

A power supply device includes a first converter configured to convert AC power from an AC power source into DC power, a second converter configured to convert a voltage to charge a backup electrical storage unit with the DC power from the first converter and to cause the electrical storage unit to discharge DC power, a plurality of cooling units configured to individually cool the first converter and the second converter, and a controller configured to change an operational state of the plurality of cooling units depending on an operational status of the power supply device.

9 Claims, 8 Drawing Sheets

FIG. 8 ental state of the plurality of cooling units depending on an
POWER SUPPLY DEVICE The contents of the following Japanese patent application are incorporated herein by reference:
NO. 2016-031258 filed in JP on Feb. 22, 2016.

BACKGROUND

Technical Field

The present invention relates to a power supply device.

It is known in the conventional art to prevent overwork of a cooling fan for a power supply device by measuring the temperature within a case of the power supply device using a temperature sensor and optimally controlling the rotational speed of the cooling fan such that the temperature within the case remains at a predetermined temperature (see, for example, Japanese Patent Application Publication No. 2005-269699).

Since the entire power supply device is cooled, however, some components are cooled even though they actually do not need to be cooled. This produces wasteful power consumption.

SUMMARY

According to a first aspect of the innovations herein, a power supply device may include a first converter, a second converter, a plurality of cooling units and a controller. The first converter may be configured to convert AC power from an AC power source into DC power. A second converter may be configured to convert a voltage to charge a backup electrical storage unit with the DC power from the first converter and to cause the electrical storage unit to discharge DC power. A plurality of cooling units may be configured to individually cool the first converter and the second converter. A controller may be configured to change an operational state of the plurality of cooling units depending on an operational status of the power supply device.

The power supply device may further include a third converter. A third converter may be configured to convert, into AC power, at least one of the DC power discharged from the electrical storage unit and the DC power fed from the first converter and feeds the AC power to a load. The plurality of cooling units may individually cool the first to third converters.

The controller may cause a cooling unit to operate corresponding to a converter in operation selected from among the first converter, the second converter and the third converter.

The controller may control a cooling unit corresponding to a converter in operation selected from among the first converter, the second converter and the third converter to produce stronger cooling effects than when the selected converter is out of operation.

The power supply device may have a first chamber, a second chamber and a third chamber partitioned from each other. The first chamber, the second chamber and the third chamber respectively may house therein the first converter, the second converter and the third converter. The first chamber, the second chamber and the third chamber may be respectively provided with a first cooling fan, a second cooling fan and a third cooling fan. The first cooling fan, the second cooling fan and the third cooling fan may serve as the plurality of cooling units and respectively cool the first converter, the second converter and the third converter.

The first converter, the second converter and the third converter may respectively include semiconductor elements. The first chamber, the second chamber and the third chamber may be respectively provided with fins to dissipate heat generated by the semiconductor elements.

The operational status of the power supply device may be selected from among a normal mode of operation, an electrical storage unit charge mode of operation, an electrical storage unit discharge mode of operation. In the normal mode of operation, the AC power source may be transmitting power and the electrical storage unit is fully charged. In an electrical storage unit charge mode of operation, the AC power source may be transmitting power and the electrical storage unit is not fully charged. In an electrical storage unit discharge mode of operation, the AC power source may be suspending the power transmission. In the normal mode of operation, the first converter and the third converter may operate. In the normal mode of operation, the controller may cause the first cooling fan and the third cooling fan to operate. In the electrical storage unit charge mode, the first converter, the second converter and the third converter may operate. In the electrical storage unit charge mode, the controller may cause the first cooling fan, the second cooling fan and the third cooling fan to operate. In the electrical storage unit discharge mode, the second converter and the third converter may operate. In the electrical storage unit discharge mode, the controller may cause the second cooling fan and the third cooling fan to operate.

The operational status of the power supply device may be selected further from a mode in which the first converter and the second converter operate when the load does not need to be powered, the AC power source is transmitting power and the electrical storage unit is not fully charged. In the mode in which the first converter and the second converter operate, the controller may cause the first cooling fan and the second cooling fan to operate.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
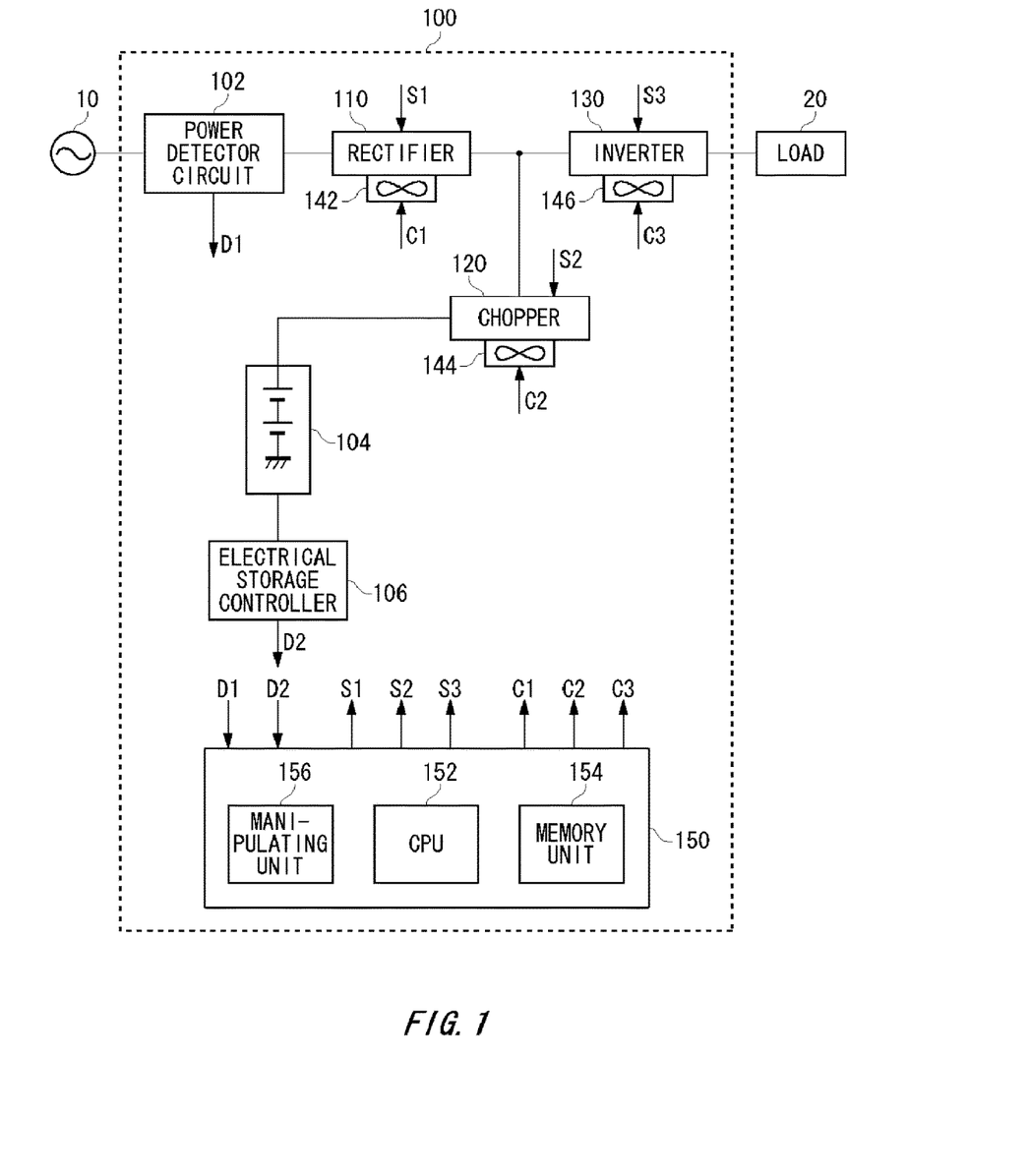
FIG. 1 is a block diagram schematically showing the structure of a power supply device 100 relating to a first embodiment.

FIG. 1 is a block diagram schematically showing the structure of a power supply device 100 relating to a first embodiment. The power supply device 100 may be an uninterruptible power supply (UPS). The uninterruptible power supply can store power in an electrical storage unit and feed the stored power to a load if power failures occur. The uninterruptible power supply is used as a power supply device for important loads such as computers. The power supply device 100 is, for example, an online uninterruptible power supply. The online UPS converts AC power of commercial frequencies into DC power to charge the electrical storage unit with the resulting DC power and converts the DC power and the DC power output from the electrical storage unit into AC power to feed the resulting AC power to a load. The online UPS is advantageous in that it is highly reliable and can supply constant AC power.

The power supply device 100 is connected to an AC power source 10 and a load 20. The AC power source 10 is a main AC power source and, for example, a system power source (commercial power source). The AC power source 10 may be a three- or single-phase AC power source. The load 20 is, for example, an information system device such as a computer. The power supply device 100 includes a rectifier 110, a chopper 120, an inverter 130, a plurality of cooling fans 142, 144 and 146, and a controller 150. The power supply device 100 may further include a power detector circuit 102, an electrical storage unit 104 and an electrical storage controller 106.

The rectifier 110 is a first converter to convert the AC power from the AC power source 10 into DC power. The DC power output from the rectifier 110 may be fed to the inverter 130 and the chopper 120. The rectifier 110 operates in response to a control signal from the controller 150.

The chopper 120 is a second converter to convert a voltage to charge the electrical storage unit 104 with the DC power from the rectifier 110 for the backup purpose and discharge the DC power from the electrical storage unit 104. The chopper 120 is connected to the DC output from the rectifier 110 and charges and discharges the electrical storage unit 104. The chopper 120 operates in response to a control signal from the controller 150.

When receiving a charge instruction from the controller 150, the chopper 120 may step down the voltage of the DC power generated by the rectifier 110 and feed the voltage-stepped-down DC power to the electrical storage unit 104. When receiving a discharge instruction from the controller 150, the chopper 120 may step up the DC voltage discharged from the electrical storage unit 104 and feed the voltage-stepped-up DC power to the inverter 130. The chopper 120 is out of operation if no charge or discharge instructions are received from the controller 150.

The inverter 130 is a third converter that converts at least one of the DC power discharged from the electrical storage unit 104 and the DC power fed from the rectifier 110 into AC power and feeds the AC power to the load 20. The rectifier 110, the chopper 120 and the inverter 130 may be power converters and include power semiconductor elements.

The cooling fans 142, 144 and 146 are cooling units to individually cool the rectifier 110, the chopper 120 and the inverter 130. The cooling fans 142, 144 and 146 include a rectifier cooling fan 142, a chopper cooling fan 144 and an inverter cooling fan 146.

The rectifier cooling fan 142, the chopper cooling fan 144 and the inverter cooling fan 146 are respectively a first cooling fan, a second cooling fan and a third cooling fan. The cooling fans 142, 144 and 146 are configured to, in response to drive signals from the controller 150, respectively cool the semiconductor elements of the rectifier 110, the semiconductor elements of the chopper 120 and the semiconductor elements of the inverter 130 by drawing in the air outside the power supply device 100 and blowing wind toward the semiconductor elements.

The rectifier cooling fan 142, the chopper cooling fan 144 and the inverter cooling fan 146 are respectively positioned to be capable of cooling the rectifier 110, the chopper 120 and the inverter 130. The controller 150 changes the operational state of the rectifier cooling fan 142, the chopper cooling fan 144 and the inverter cooling fan 146, depending on the operational status of the power supply device 100. The rectifier cooling fan 142 cools the rectifier 110 on reception of a drive signal from the controller 150. The chopper cooling fan 144 cools the chopper 120 on reception of a drive signal from the controller 150. The inverter cooling fan 146 cools the inverter 130 on reception of a drive signal from the controller 150.

Specifically speaking, the controller 150 may drive the cooling fan corresponding to the converter in operation, which is selected from among the rectifier 110, the chopper 120 and the inverter 130. The rectifier cooling fan 142 may operate to cool the rectifier 110 if the rectifier 110 is in operation and may not operate or cool the rectifier 110 if the rectifier 110 is out of operation.

Likewise, the chopper cooling fan 144 may operate to cool the chopper 120 if the chopper 120 is in operation and may not operate or cool the chopper 120 if the chopper 120 is out of operation. The inverter cooling fan 146 may operate to cool the inverter 130 if the inverter 130 is in operation and may not operate or cool the inverter 130 if the inverter 130 is out of operation.

The power detector circuit 102 is, for example, constituted by detector elements such as detector resistances. The power detector circuit 102 detects the status of the power input from the AC power source 10 in order to judge whether the AC power source 10 is transmitting power or suspending the power transmission. The results of the detection D1 are sent to the controller 150. The electrical storage unit 104 is a device to preserve electricity. The electrical storage unit 104 may be a battery or electric double-layer capacitor. To cool the electrical storage unit 104, a cooling unit such as a cooling fan may be separately provided.

The electrical storage controller 106 measures various physical quantities for the electrical storage unit 104 in order to control the electrical storage unit 104. For example, the electrical storage controller 106 measures the currents flowing while the electrical storage unit 104 is charged and discharged, the voltage of the electrical storage unit 104, and the temperature of the electrical storage unit 104. The electrical storage controller 106 uses the measurements to calculate the information as to whether the electrical storage unit 104 is fully charged, for example, the charge rate. The results of the calculation D2 are sent to the controller 150.

The controller 150 acquires the results of the detection D1 from the power detector circuit 102 and the results of the calculation D2 from the electrical storage controller 106. The controller 150 controls the rectifier 110, the chopper 120 and the inverter 130 using control signals S1, S2 and S3. The controller 150 may control the rectifier cooling fan 142, the chopper cooling fan 144 and the inverter cooling fan 146 by sending drive signals C1, C2 and C3.

The controller 150 may include a CPU 152, a memory unit 154 and a manipulating unit 156. The CPU 152 performs various operations and controls based on the results of the detection D1 from the power detector circuit 102, the results of the calculation D2 from the electrical storage controller 106 and the instructions from the manipulating unit 156. The memory unit 154 may be a non-volatile storage medium such as semiconductor memory and hard disk drive and stores thereon various values, data and programs. The manipulating unit 156 is user interface such as switches, buttons or touch panels. A user can enter various instructions into the power supply device 100 through the manipulating unit 156.

Figure 2:
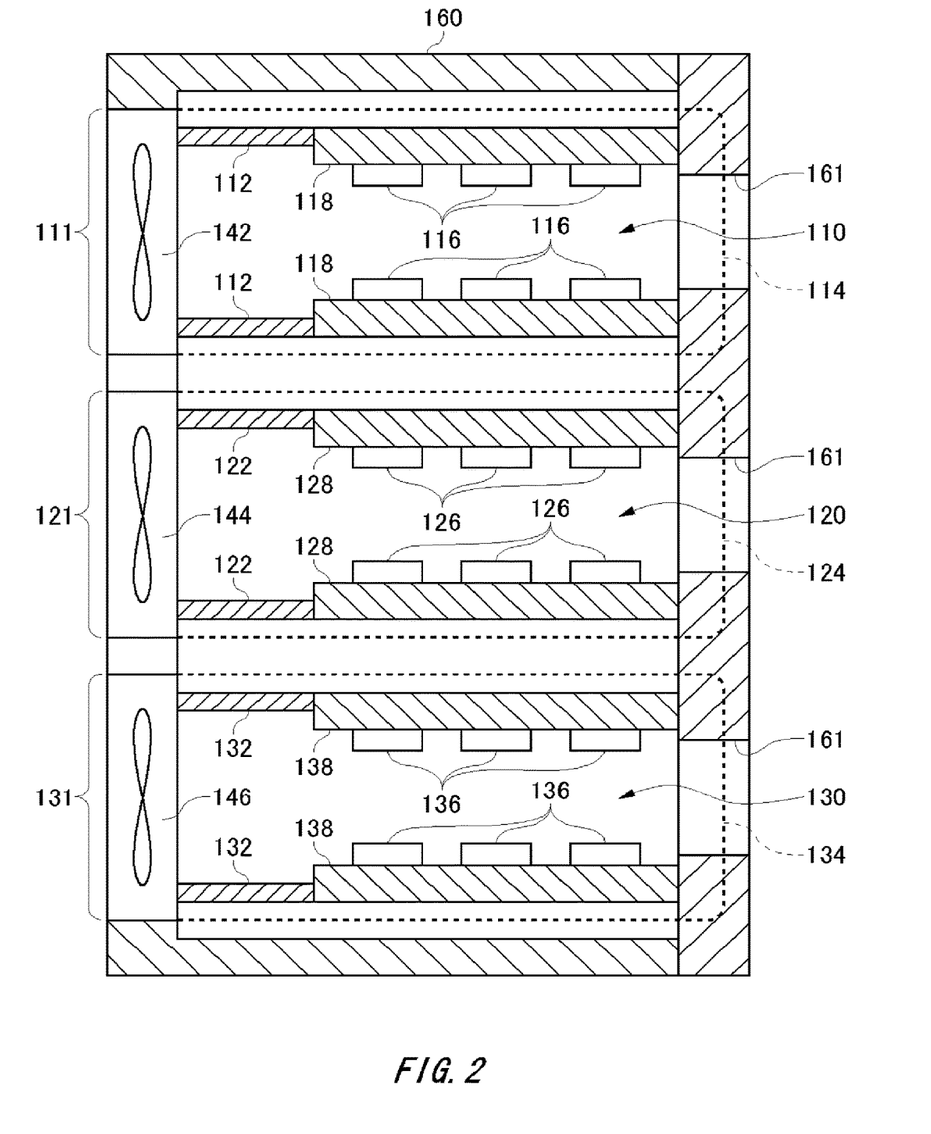
FIG. 2 is a cross-sectional view schematically showing the structure of the power supply device 100 relating to the first embodiment.

FIG. 2 is a cross-sectional view schematically showing the overall structure of the power supply device 100 relating to the first embodiment. The power supply device 100 has a first chamber 111, a second chamber 121 and a third chamber 131 partitioned from each other, within a case 160. The first chamber 111 houses therein the rectifier 110. The first chamber 111 has the rectifier cooling fan 142 provided at the entrance end thereof. The second chamber 121 houses therein the chopper 120. The second chamber 121 has the chopper cooling fan 144 provided at the entrance end thereof. The third chamber 131 houses therein the inverter 130. The third chamber 131 has the inverter cooling fan 146 provided at the entrance end thereof. The first chamber 111, the second chamber 121 and the third chamber 131 respectively have outlets 161 provided at the exit ends thereof.

At the entrance end of the first chamber 111, a partition plate 112 may be provided to prevent the wind generated by the rectifier cooling fan 142 from blowing into the other chambers. According to the present example, the partition plate 112 forms a wind introduction path between the rectifier cooling fan 142 and the rectifier 110.

The rectifier 110 within the first chamber 111 includes semiconductor elements 116. For example, the rectifier 110 may include a plurality of power semiconductor devices. In the first chamber 111, a circuit board 114 of the rectifier 110 may be placed. In the present example, the circuit board 114 may also serve as an upper plate to cover the first chamber 111 as indicated by the dotted line in FIG. 2. The semiconductor elements 116 are electrically connected to the circuit board 114. In the first chamber 111, a fin 118 may be provided to dissipate the heat generated by the semiconductor elements 116.

Likewise, a partition plate 122 is provided at the entrance end of the second chamber 121 and a partition plate 132 is provided at the entrance end of the third chamber 131. The partition plates 122 and 132 respectively form wind introduction paths. The chopper 120 within the second chamber 121 includes semiconductor elements 126, and the inverter 130 within the third chamber 131 includes semiconductor elements 136. In the second chamber 121, a circuit board 124 may be placed and connected to the semiconductor elements 126. In the third chamber 131, a circuit board 134 may be placed and connected to the semiconductor elements 136.

In the second chamber 121 and the third chamber 131, fins 128 and 138 may be respectively provided to dissipate the heat generated by the semiconductor elements 126 and 136. The second chamber 121 and the third chamber 131 may have similar structures as the first chamber 111 except for that a different number of semiconductor elements 116 are provided and the circuit board 114 has different circuit interconnections due to the different circuit structure. Since the fins 118, 128 and 138 are separately provided in the respective chambers, the heat generated by the semiconductor elements 116, 126 and 136 within the respective chambers can be efficiently dissipated.

The converters such as the rectifier 110, the chopper 120 and the inverter 130 respectively have independent stack structures constituted by the semiconductor elements 116, 126 and 136 and the cooling fans 142, 144 and 146. The power supply device 100 is structured in such a manner that the independent first chamber 111, second chamber 121 and third chamber 131 are arranged next to each other. The first chamber 111, the second chamber 121 and the third chamber 131, however, may not be necessarily perfectly separated from each other across their entire regions. In the present example, the partition plates 112, 122 and 132 are provided only to form the wind introduction paths at the entrance ends of the first chamber 111, the second chamber 121 and the third chamber 131. Thus, the partition plates 112, 122 and 132 do not need to extend across the entire length of the corresponding chambers.

The partition plates 112, 122 and 132 do not extend over the fins 118, 128 and 138. This externally exposes the fins 118, 128 and 138 and thus may encourage the heat dissipation through the fins 118, 128 and 138. In the present example, the circuit board 114, the circuit board 124 and the circuit board 134 are independently provided in the first chamber 111, the second chamber 121 and the third chamber 131 respectively. The embodiments, however, are not limited to such. A single circuit board that serves as the circuit boards 114, 124 and 134 may be placed across the first chamber 111, the second chamber 121 and the third chamber 131.

Figure 3:
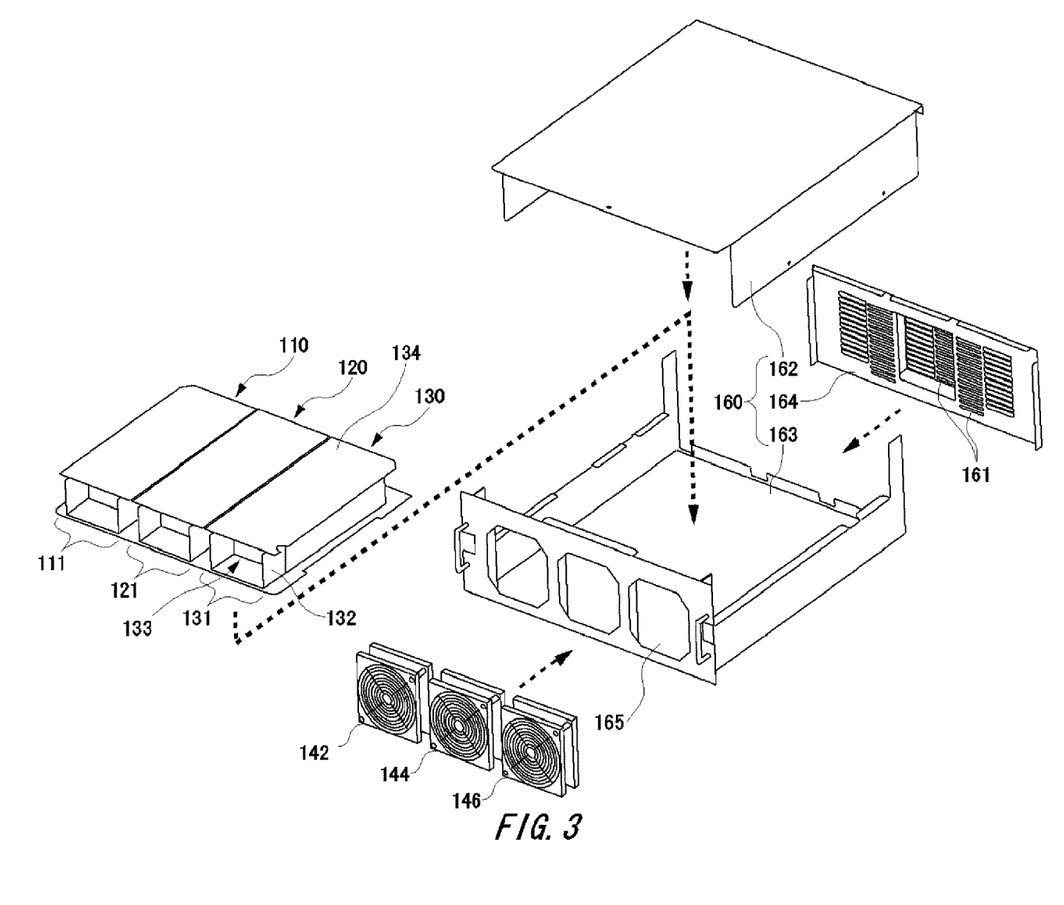
FIG. 3 is an exploded perspective view showing the structure of the power supply device 100 relating to the first embodiment.

FIG. 3 is an exploded perspective view showing the structure of the power supply device 100 relating to the first embodiment. As shown in FIG. 3, the rectifier 110, the chopper 120 and the inverter 130 are housed within the first chamber 111, the second chamber 121 and the third chamber 131 independently from each other.

The case 160 of the power supply device 100 is partitioned into the first chamber 111, the second chamber 121 and the third chamber 131, in which the rectifier 110, the chopper 120 and the inverter 130 are respectively placed as the main circuits. In the present embodiment, the case 160 includes an upper cover 162, a base 163, and an outlet-side panel 164. However, the embodiments are not limited to such. The structure of the case 160 can be changed as appropriate.

At the end surface of the case 160, three fan attachment slots 165 may be provided and aligned with the positions of the first chamber 111, the second chamber 121 and the third chamber 131. At the fan attachment slots 165, the rectifier cooling fan 142, the chopper cooling fan 144 and the inverter cooling fan 146 are mounted.

In the present example, the U-shaped partition plate 132 is provided at the entrance of the third chamber 131. By bringing the circuit board 134 into contact with the partition plate 132, the partition plate 132 and the circuit board 134 form a tubular wind tunnel 133. The wind tunnel 133 prevents the wind generated by the inverter cooling fan 146 from flowing into the other chambers. The entrances of the first chamber 111 and the second chamber 121 may have similar structures.

In the outlet-side panel 164, outlets 161 may be provided in correspondence with the first chamber 111, the second chamber 121 and the third chamber 131. Taking the third chamber 131 as an example, the wind flow that has cooled the inverter 130 including the semiconductor elements 136 connected to the circuit board 134 exits through the above-described outlet 161. Likewise, the wind flows that have respectively cooled the rectifier 110 and the chopper 120 exit through the corresponding outlets 161.

Figure 4:
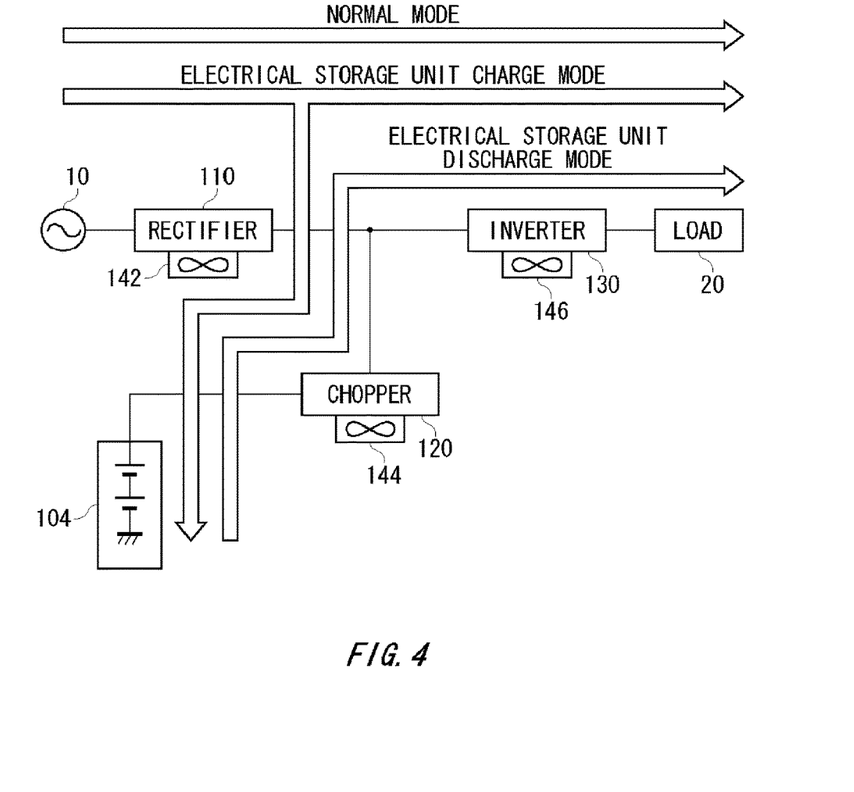
FIG. 4 illustrates a plurality of modes of operation for the power supply device 100 relating to the first embodiment.

In the present embodiment, the controller 150 of the power supply device 100 changes the operational state of the rectifier cooling fan 142, the chopper cooling fan 144 and the inverter cooling fan 146 depending on the operational status of the power supply device 100. The operational status of the power supply device 100 may be selected from a normal mode of operation, an electrical storage unit charge mode of operation and an electrical storage unit discharge mode of operation. FIG. 4 illustrates a plurality of modes of operation in which the power supply device 100 relating to the first embodiment can operate. The controller 150 uses the control signals to cause the rectifier 110, the chopper 120 and the inverter 130 to operate depending on the mode of operation of the power supply device 100. The control signals may be gate pulse signals.

The power supply device 100 enters the normal mode of operation when the AC power source 10 is transmitting power and the electrical storage unit 104 is fully charged. In the normal mode, the controller 150 instructs the rectifier 110 and the inverter 130 to operate and the chopper 120 not to operate. The rectifier 110 converts the AC power from the AC power source 10 into DC power and outputs the resulting DC power to the inverter 130. The inverter 130 converts the DC power into constant AC power and feeds the AC power to the load 20.

The power supply device 100 enters the electrical storage unit charge mode of operation when the AC power source 10 is transmitting power and the electrical storage unit 104 is not fully charged. In the electrical storage unit charge mode, the controller 150 instructs the rectifier 110, the chopper 120 and the inverter 130 to operate. The rectifier 110 converts the AC power from the AC power source 10 into DC power and outputs the resulting DC power to the chopper 120 and the inverter 130. The inverter 130 converts the DC power into constant AC power and feeds the AC power to the load 20. The chopper 120 converts the DC voltage output from the rectifier 110 into a battery voltage, with which the electrical storage unit 104 is charged.

The power supply device 100 enters the electrical storage unit discharge mode of operation when the AC power source 10 is suspending the power transmission. In the electrical storage unit discharge mode, the load 20 is powered based on the DC power fed from the electrical storage unit 104. Accordingly, the electrical storage unit discharge mode is also referred to as an electrical storage unit feeding mode of operation. In the electrical storage unit discharge mode, the controller 150 instructs the chopper 120 and the inverter 130 to operate and the rectifier 110 not to operate. The chopper 120 causes the electrical storage unit 104 to discharge DC power, and the inverter 130 converts the discharged DC power into constant AC power and feeds the AC power to the load 20.

Figure 5:
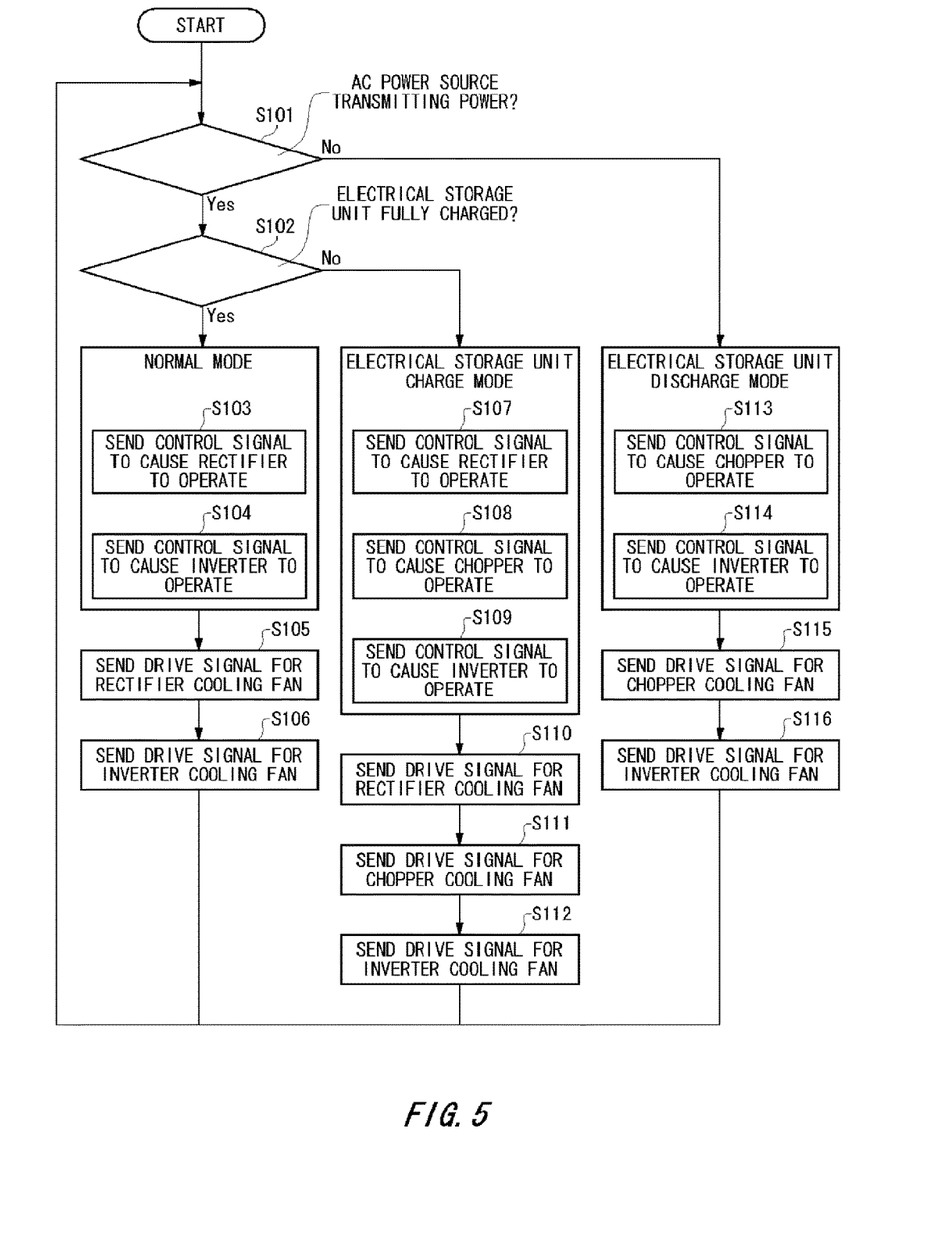
FIG. 5 is a flow chart showing the operations performed by a controller 150 of the power supply device 100 relating to the first embodiment.

FIG. 5 is a flow chart showing the operations performed by the controller 150 of the power supply device 100 relating to the first embodiment. The controller 150 judges whether the AC power source 10 is transmitting power (step S101). The controller 150 may acquire the results of the detection from the power detector circuit 102 and judge whether the AC power source 10 is transmitting power or suspending the power transmission based on the acquired results of the detection.

The controller 150 judges whether the electrical storage unit 104 is fully charged (step S102). The controller 150 may acquire the charge rate calculated by the electrical storage controller 106 and judge whether the electrical storage unit 104 is fully charged based on the acquired charge rate. As used herein, the phrase "fully charged" may mean a charge rate of predetermined threshold or higher and not necessarily indicate a charge rate of 100%. If the AC power source 10 is transmitting power (step S101: Yes) and the electrical storage unit 104 is fully charged (step S102: Yes), the controller 150 performs operations corresponding to the normal mode (steps S103 and S104).

In the normal mode, the controller 150 sends a control signal to cause the rectifier 110 to operate (step S103) and sends a control signal to cause the inverter 130 to operate (step S104). Since it is not necessary to charge the electrical storage unit 104 or cause the electrical storage unit 104 to discharge, it is not necessary to cause the chopper 120 to operate.

The controller 150 sends a drive signal for the rectifier cooling fan 142 (step S105) and sends a drive signal for the inverter cooling fan 146 (step S106). Accordingly, in the normal mode, the controller 150 causes the rectifier cooling fan 142 and the inverter cooling fan 146 to operate correspondingly to the rectifier 110 and the inverter 130 that are in operation and does not cause the chopper cooling fan 144 to operate correspondingly to the chopper 120 that is out of operation.

If the AC power source 10 is transmitting power (step S101: Yes) and the electrical storage unit 104 is not fully charged (step S102: No), the controller 150 performs operations for the electrical storage unit charge mode (steps S107, S108 and S109). In the electrical storage unit charge mode, the power supply device 100 uses the power from the AC power source 10 to charge the electrical storage unit 104 and to concurrently feed power to the load 20 through the inverter 130. Accordingly, the rectifier 110, the chopper 120 and the inverter 130 are all required to operate.

The controller 150 sends control signals respectively to cause the rectifier 110, the chopper 120 and the inverter 130 to operate (steps S107, S108 and S109). In the electrical storage unit charge mode, the controller 150 sends drive signals to cause the rectifier cooling fan 142, the chopper cooling fan 144 and the inverter cooling fan 146 to operate correspondingly to the rectifier 110, the chopper 120 and the inverter 130 that are in operation (steps S110, S111 and S112).

If the AC power source 10 is suspending the power transmission (step S101: No), the controller 150 performs operations for the electrical storage unit discharge mode (steps S113 and S114) irrespective of whether the electrical storage unit 104 is fully charged. In the electrical storage unit discharge mode, there is no point of causing the rectifier 110 to operate since no power is fed from the AC power source 10. In the power supply device 100, the electrical storage unit 104 also feeds power to the load 20 via the inverter 130.

Accordingly, the controller 150 sends control signals to cause the chopper 120 and the inverter 130 to operate (steps S113 and S114). Therefore, in the electrical storage unit discharge mode, the controller 150 sends drive signals to cause the chopper cooling fan 144 and the inverter cooling fan 146 to operate correspondingly to the chopper 120 and the inverter 130 that are in operation (steps S115 and S116).

As described above, the power supply device 100 may be constantly in operation but some of the converters including the rectifier 110, the chopper 120 and the inverter 130 may be out of operation depending on the mode of operation of the power supply device 100. The converters out of operation experience only a small temperature rise. Therefore, it is not necessary to drive the cooling fans corresponding to the converters out of operation. According to the power supply device 100 of the present example, the operational state of the cooling fans 142, 144 and 146 is changed depending on the operational status of the power supply device 100. This enables the cooling fans 142, 144 and 146 to achieve smaller power consumption than in the conventional art and the motors to rotate the cooling fans 142, 144 and 146 to accomplish longer lifetime.

In particular, in the power supply device 100 of the present example, only the cooling fans corresponding to the converters in operation, which are selected from among the rectifier 110, the chopper 120 and the inverter 130, are driven. Therefore, the power supply device 100 of the present example is more effective in achieving smaller power consumption and longer motor lifetime than an ordinary power supply device. In addition, since the power supply device 100 of the present example has the chambers partitioned from each other and has the cooling fans individually in the respective chambers, the wind generated in one of the chambers can be prevented from flowing into the adjacent chambers and the individual chambers can be separately cooled depending on the operational status of the power supply device 100.

The following describes a power supply device 100 of a second embodiment. The power supply device 100 relating to the second embodiment is the same as the power supply device 100 relating to the first embodiment except for that the inverter cooling fan 146 is constantly in operation. Therefore, the redundant descriptions are skipped and the similar components are assigned with the same reference numerals.

Figure 6:
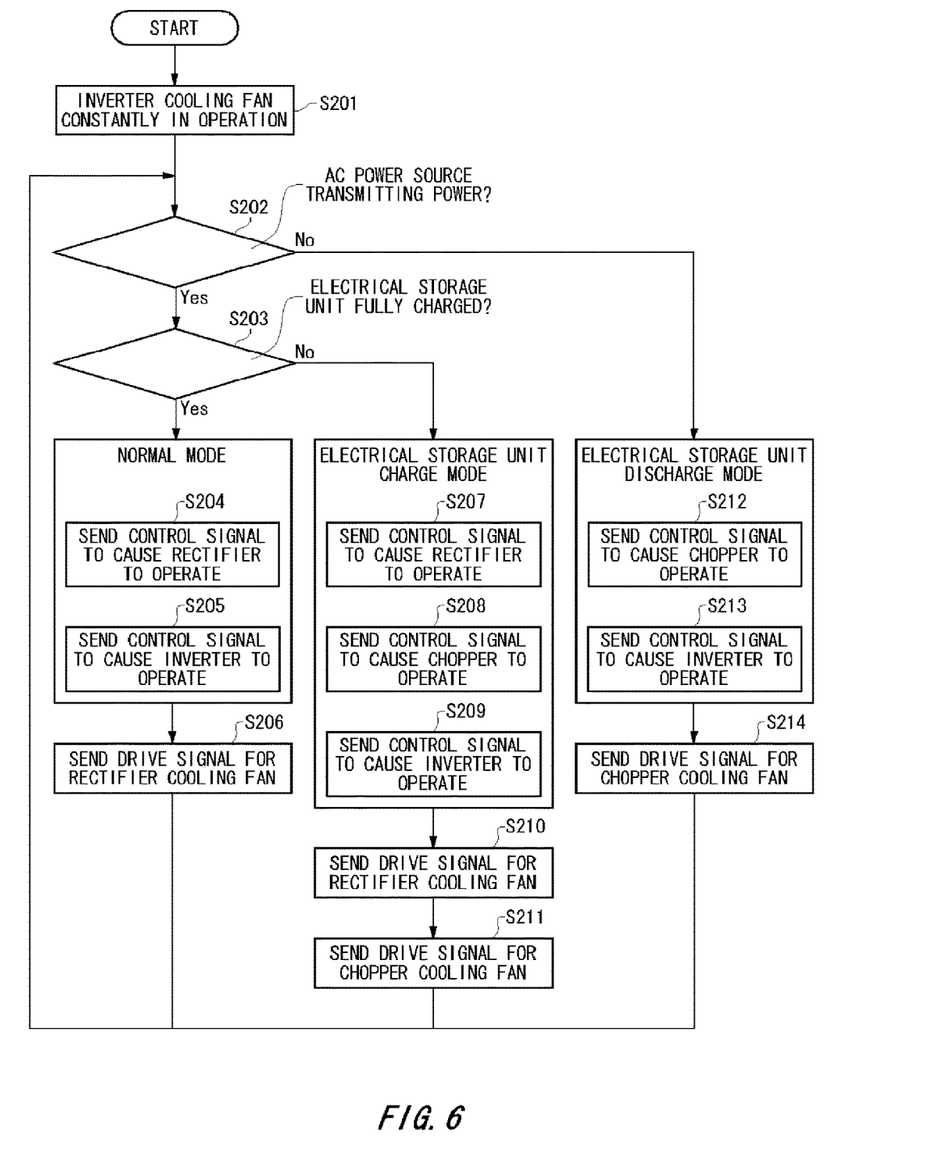
FIG. 6 is a flow chart showing the operations performed by a controller 150 of a power supply device 100 relating to a second embodiment.

FIG. 6 is a flow chart showing the operations performed by the controller 150 of the power supply device 100 relating to the second embodiment. The inverter cooling fan 146 is constantly in operation (step S201), irrespective of whether the AC power source 10 is transmitting power (step S202) and whether the electrical storage unit 104 is fully charged (step S203). The inverter cooling fan 146 is constantly in operation considering that the inverter 130 is constantly in operation when the power supply device 100 is of the online type.

The controller 150 changes the operational state of the rectifier cooling fan 142 and the chopper cooling fan 144 depending on the operational status of the power supply device 100 and does not switch off the inverter cooling fan 146. The operations in the steps S202 to S206 are the same as the operations in the steps S101 to S105 shown in FIG. 5. The operations in the steps S207 to S211 are the same as the operations in the steps S107 to S111 shown in FIG. 5. The operations in the steps S212 to S214 are the same as the operations in the steps S113 to S115 shown in FIG. 5. Accordingly, the redundant descriptions are skipped.

According to the second embodiment, if the power supply device 100 is of the online type, the cooling fans 142 and 144 can also achieve smaller power consumption and the motors to rotate the cooling fans 142 and 144 can also achieve a longer lifetime as in the first embodiment.

Figure 7:
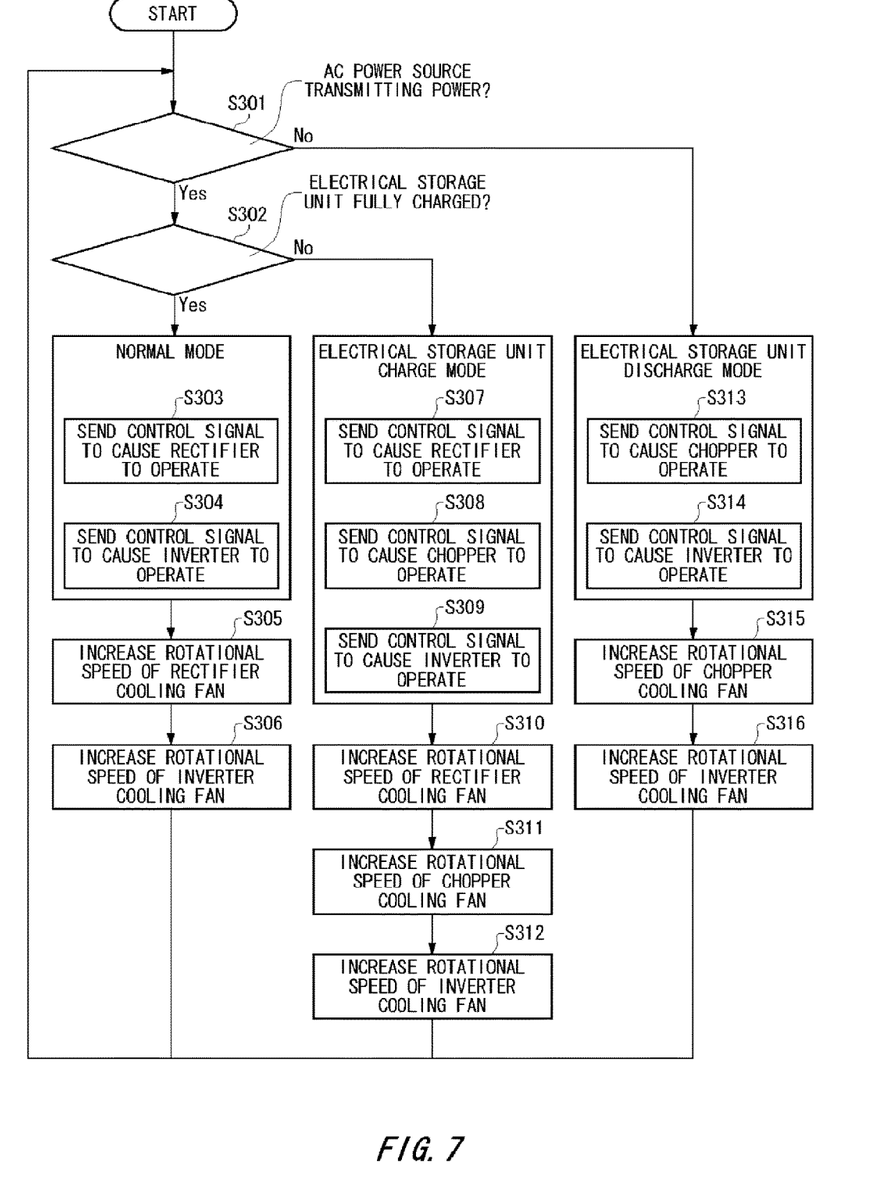
FIG. 7 is a flow chart showing the operations performed by a controller 150 of a power supply device 100 relating to a third embodiment.

The following describes a power supply device 100 relating to a third embodiment. FIG. 7 is a flow chart showing the operations performed by the controller 150 in the power supply device 100 relating to the third embodiment. In the first embodiment, the controller 150 drives only the cooling fans corresponding to the converters in operation, which are selected from among the rectifier 110, the chopper 120 and the inverter 130. In contrast to this, in the power supply device 100 of the third embodiment, the cooling fans corresponding to the converters including the rectifier 110, the chopper 120 and the inverter 130, produce stronger cooling effects when the converters are in operation than when the converters are out of operation.

Specifically speaking, the controller 150 controls the cooling fans corresponding to the converters to rotate at a higher speed when the converters are in operation than when the converters are out of operation. Except for this, the power supply device 100 relating to the third embodiment has the same configurations as the power supply devices 100 relating to the first and second embodiments. Therefore, the redundant descriptions are skipped and the same components are assigned with the same reference numerals.

The operations in the steps S301 to S304 are the same as the operations in the steps S101 to S104 shown in FIG. 5. Accordingly, the redundant descriptions are skipped. In the normal mode (steps S303 and S304), the controller 150 increases the rotational speed of the rectifier cooling fan 142 corresponding to the rectifier 110, which is in operation, when compared with the rotational speed of the rectifier cooling fan 142 observed when the rectifier 110 is out of operation (step S305). Likewise, the controller 150 increases the rotational speed of the inverter cooling fan 146 corresponding to the inverter 130, which is in operation, when compared with the rotational speed of the inverter cooling fan 146 observed while the inverter 130 is out of operation (step S306).

The operations in the steps S307 to S309 are the same as the operations in the steps S107 to S109 shown in FIG. 5. In the electrical storage unit charge mode (steps S307, S308 and S309), the controller 150 increases the rotational speeds of the cooling fans corresponding to the rectifier 110, the chopper 120 and the inverter 130 that are in operation. Specifically speaking, the controller 150 increases the rotational speeds of the rectifier cooling fan 142, the chopper cooling fan 144 and the inverter cooling fan 146 when compared with the rotational speeds of the respective cooling fans observed when the rectifier 110, the chopper 120 and the inverter 130 are out of operation (steps S310, S311 and S312).

The operations in the steps S313 and S314 are the same as the operations in the steps S113 and S114 shown in FIG. 5. In the electrical storage unit discharge mode (the steps S313 and S314), the controller 150 increases the rotational speeds of the cooling fans corresponding to the chopper 120 and the inverter 130 that are in operation. Specifically speaking, the controller 150 increases the rotational speeds of the chopper cooling fan 144 and the inverter cooling fan 146 when compared with the rotational speeds of the cooling fans observed when the chopper 120 and the inverter 130 are out of operation (steps S315 and S316).

The power supply device 100 of the present example controls the cooling fans to produce stronger cooling effects only for the converters in operation. In this way, stronger cooling effects are produced for the converters in operation and the cooling effects are not enhanced for the converters that do not require cooling so much. As a consequence, the third embodiment can achieve smaller power consumption for the cooling units than in the conventional art and realize longer lifetime for the cooling units.

The following describes a power supply device 100 relating to a fourth embodiment. The operational status of the power supply device 100 relating to the present example is selected from among a normal mode of operation, an electrical storage unit charge mode of operation, an electrical storage unit discharge mode of operation and a rectifier-only mode of operation. Here, the first three modes of operation are already described in the first embodiment.

The power supply device 100 enters the rectifier-only mode when it is not necessary to feed power to the load 20, the AC power source 10 is transmitting power, and the electrical storage unit 104 is not fully charged. In the rectifier-only mode, the rectifier 110 and the chopper 120 are in operation. There are cases where the power supply device 100 does not need to feed power to the load 20, for example, when the load 20 is out of operation. In this case, however, it is desirable to charge the electrical storage unit 104 to prevent the charge rate of the electrical storage unit 104 from dropping due to the self-discharge.

Figure 8:
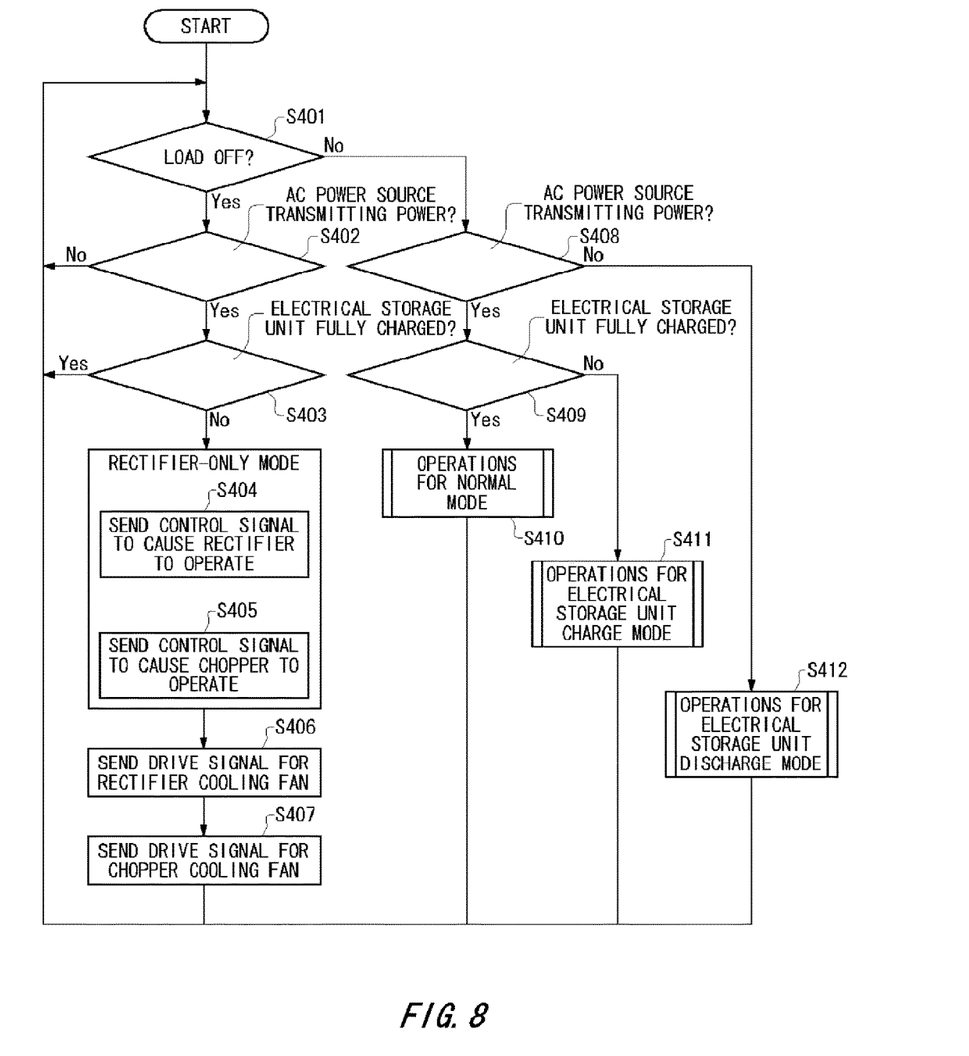
FIG. 8 is a flow chart showing the operations performed by a controller 150 of a power supply device 100 relating to a fourth embodiment.

In the rectifier-only mode, the controller 150 instructs only the rectifier 110 and the chopper 120 to operate. The rectifier 110 converts the AC power from the AC power source 10 into DC power and outputs the DC power to the chopper 120. The chopper 120 converts the DC voltage output from the rectifier 110 into a battery voltage, with which the electrical storage unit 104 is charged. FIG. 8 is a flow chart showing the operations performed by the controller 150 in the power supply device 100 relating to the fourth embodiment. The flow chart shown in FIG. 8 will be described taking as an example a case where the load 20 does not require power supply because the load 20 is out of operation.

The controller 150 judges whether the load 20 is out of operation (OFF) (step S401). The controller 150 may judge whether the load 20 is out of operation, for example, based on whether there is an instruction from a user or with reference to the information from the load 20. The controller 150 judges whether the AC power source 10 is transmitting power (step S402). In addition, the controller 150 judges whether the electrical storage unit 104 is fully charged. The judging operations in the steps in S401 and S402 are the same as the operations in the steps S101 and S102 shown in FIG. 5.

If the load 20 is out of operation (step S401: Yes), the AC power source 10 is transmitting power (step S402: Yes), and the electrical storage unit 104 is not fully charged (step S403: No), the controller 150 performs operations corresponding to the rectifier-only mode (steps S404 and S405).

In the rectifier-only mode, the controller 150 sends a control signal to cause the rectifier 110 to operate (step S404) and sends a control signal to cause the chopper 120 to operate (step S405). It is not necessary to cause the inverter 130 to operate since it is not necessary to power the load 20.

The controller 150 sends a drive signal for the rectifier cooling fan 142 (step S406) and sends a drive signal for the chopper cooling fan 144 (step S407). Accordingly, in the rectifier-only mode, the controller 150 causes the rectifier cooling fan 142 and the chopper cooling fan 144 to operate correspondingly to the rectifier 110 and the chopper 120 that are in operation and does not cause the inverter cooling fan 146 to operate correspondingly to the inverter 130 that is out of operation.

Here, when the load 20 is out of operation (step S401: Yes), the power supply device 100 does not enter the rectifier-only mode and may go back to the operation in the step S401 if the AC power source 10 is suspending the power transmission (step S402: No) or the electrical storage unit 104 is fully charged (step S403: Yes). If the load 20 is not out of operation (step S401: No), the step S408 and the following steps are performed.

If the AC power source 10 is transmitting power (step S408: Yes) and the electrical storage unit 104 is fully charged (step S409: Yes), the controller 150 may perform the operations corresponding to the normal mode (step S410). If the AC power source 10 is transmitting power (step S408: No) and the electrical storage unit 104 is not fully charged (step S409: No), the controller 150 performs the operations corresponding to the electrical storage unit charge mode (step S411). On the other hand, if the AC power source 10 is suspending the power transmission (step S408: No), the controller 150 performs the operations corresponding to the electrical storage unit discharge mode irrespective of whether the electrical storage unit 104 is fully charged (step S412).

The operations corresponding to the normal mode (step S410) may be the same as the operations in the steps S103 to S106 relating to the first embodiment shown in FIG. 5. The operations corresponding to the electrical storage unit charge mode (step S411) may be the same as the operations in the steps S107 to S112 shown in FIG. 5, and the operations corresponding to the electrical storage unit discharge mode (step S412) may be the same as the operations in the steps S113 to S116 shown in FIG. 5. Therefore, these operations are not redundantly described.

According to the above-described first to fourth embodiments, the cooling fans are provided in a one-to-one correspondence with the converters including the rectifier 110, the chopper 120 and the inverter 130. The present invention, however, is not limited to this respect. Alternatively, a plurality of cooling fans may be provided for each of the converters including the rectifier 110, the chopper 120 and the inverter 130. In addition, the present invention includes an embodiment where one cooling fan is configured to cool the rectifier 110 and the inverter 130 and another cooling fan is configured to cool the chopper 120 and the inverter 130 and the operational state of these cooling fans is changed depending on the operational status of the power supply device 100.

The above description is made taking a plurality of cooling fans as an example of the plurality of cooling units. However, the plurality of cooling units are not limited to such cooling fans. If the water-cooling approach is employed, the cooling units may include cooling devices such as cooling pumps and the like.

The above description is made taking as an example the power supply device 100 that includes a single rectifier 110, a single chopper 120 and a single inverter 130 as a first converter, a second converter and a third converter. The present invention, however, can be applied to any power supply devices 100 that at least include a plurality of cooling units configured to individually cool a first converter and a second converter and that can change the operational state of the plurality of cooling units depending on the operational status of the power supply devices 100, regardless of the power feeding scheme type of the power supply devices 100 and the number of the converters.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10 . . . AC power source, 20 . . . load, 100 . . . power supply device, 102 . . . power detector circuit, 104 . . . electrical storage unit, 106 . . . electrical storage controller, 110 . . . rectifier, 111 . . . first chamber, 112 . . . partition plate, 114 . . . circuit board, 116 . . . semiconductor element, 118 . . . fin, 120 . . . chopper, 121 . . . second chamber, 122 . . . partition plate, 124 . . . circuit board, 126 . . . semiconductor element, 128 . . . fin, 130 . . . inverter, 131 . . . third chamber, 132 . . . partition plate, 133 . . . wind tunnel, 134 . . . circuit board, 136 . . . semiconductor element, 138 . . . fin, 142 . . . rectifier cooling fan, 144 . . . chopper cooling fan, 146 . . . inverter cooling fan, 150 . . . controller, 152 . . . CPU, 154 . . . memory unit, 156 . . . manipulating unit, 160 . . . case, 161 . . . outlet, 162 . . . upper cover, 163 . . . base, 164 . . . outlet-side panel, 165 . . . fan attachment slot

The invention claimed is:

1. A power supply device comprising;
a first converter configured to convert AC power from an AC power source into DC power;
a second converter configured to convert a voltage to charge a backup electrical storage unit with the DC power from the first converter and to cause the electrical storage unit to discharge DC power;
a plurality of cooling units configured to individually cool the first converter and the second converter; and
a controller configured to change an operational state of the plurality of cooling units depending on control signals that cause the first converter and the second converter to operate.

2. A power supply device comprising;
a first converter configured to convert AC power from an AC power source into DC power;
a second converter configured to convert a voltage to charge a backup electrical storage unit with the DC power from the first converter and to cause the electrical storage unit to discharge DC power;
a third converter configured to convert, into AC power, at least one of the DC power discharged from the electrical storage unit and the DC power fed from the first converter and feeds the AC power to a load;
a plurality of cooling units configured to individually cool the first to third converters; and
a controller configured to change an operational state of the plurality of cooling units depending on an operational status of the power supply device.

3. The power supply device as set forth in claim 2, wherein
the controller causes a cooling unit to operate corresponding to a converter in operation selected from among the first converter, the second converter and the third converter.

4. The power supply device as set forth in claim 2, wherein
the controller controls a cooling unit corresponding to a converter in operation selected from among the first converter, the second converter and the third converter to produce stronger cooling effects than when the selected converter is out of operation.

5. The power supply device as set forth in claim 2, wherein
the power supply device has a first chamber, a second chamber and a third chamber partitioned from each other,
the first chamber, the second chamber and the third chamber respectively house therein the first converter, the second converter and the third converter,
the first chamber, the second chamber and the third chamber are respectively provided with a first cooling fan, a second cooling fan and a third cooling fan, and
the first cooling fan, the second cooling fan and the third cooling fan serve as the plurality of cooling units and respectively cool the first converter, the second converter and the third converter.

6. The power supply device as set forth in claim 5, wherein
the first converter, the second converter and the third converter respectively include semiconductor elements, and
the first chamber, the second chamber and the third chamber are respectively provided with fins to dissipate heat generated by the semiconductor elements.

7. A power supply device comprising;
a first converter configured to convert AC power from an AC power source into DC power;
a second converter configured to convert a voltage to charge a backup electrical storage unit with the DC power from the first converter and to cause the electrical storage unit to discharge DC power;
a third converter configured to convert, into AC power, at least one of the DC power discharged from the electrical storage unit and the DC power fed from the first converter and feeds the AC power to a load;
a plurality of cooling units configured to individually cool the first to third converters; and
a controller configured to change an operational state of the plurality of cooling units depending on an operational status of the power supply device, wherein
the power supply device has a first chamber, a second chamber and a third chamber partitioned from each other,
the first chamber, the second chamber and the third chamber respectively house therein the first converter, the second converter and the third converter,
the first chamber, the second chamber and the third chamber are respectively provided with a first cooling unit, a second cooling unit and a third cooling unit, and
the first cooling unit, the second cooling unit and the third cooling unit serve as the plurality of cooling units and respectively cool the first converter, the second converter and the third converter,
the operational status of the power supply device is selected from among:
a normal mode of operation in which the AC power source is transmitting power and the electrical storage unit is fully charged;
an electrical storage unit charge mode of operation in which the AC power source is transmitting power and the electrical storage unit is not fully charged; and an electrical storage unit discharge mode of operation in which the AC power source is suspending the power transmission, in the normal mode of operation, the first converter and the third converter operate and the controller causes the first cooling unit and the third cooling unit to operate, in the electrical storage unit charge mode of operation, the first converter, the second converter and the third converter operate, and the controller causes the first cooling unit, the second cooling unit and the third cooling unit to operate, and in the electrical storage unit discharge mode of operation, the second converter and the third converter operate, and the controller causes the second cooling fan unit and the third cooling unit to operate.

8. The power supply device as set forth in claim 7, wherein the operational status of the power supply device is selected further from a mode in which the first converter and the second converter operate when the load does not need to be powered, the AC power source is transmitting power and the electrical storage unit is not fully charged, and in the mode in which the first converter and the second converter operate, the controller causes the first cooling unit and the second cooling unit to operate.

9. The power supply device as set forth in claim 8, wherein the first cooling unit, the second cooling unit and the third cooling unit are a first cooling fan, a second cooling fan and a third cooling fan, respectively.

\* \* \* \* \*